United States Patent [19]

Huffman

[11] 3,797,102

[45] Mar. 19, 1974

[54] METHOD OF MAKING SEMICONDUCTOR DEVICES

[75] Inventor: Tommie R. Huffman, Tempe, Ariz.

[73] Assignee: Motorola, Inc., Franklin Park, Ill.

[22] Filed: Jan. 7, 1966

[21] Appl. No.: 519,227

Related U.S. Application Data

[62] Division of Ser. No. 440,421, March 17, 1965, Pat. No. 3,393,349, which is a division of Ser. No. 363,802, April 30, 1964, abandoned.

[52] U.S. Cl. .......................... 29/577, 29/580, 29/578

[51] Int. Cl. .............................................. B01j 17/00

[58] Field of Search ............. 29/577, 578, 580, 583, 29/576 IW; 317/235, 101 A; 148/1.5, 175

[56] References Cited

UNITED STATES PATENTS

| | | | |
|---|---|---|---|
| 3,247,428 | 4/1966 | Perri et al. | 29/578 UX |
| 3,290,753 | 12/1966 | Chang | 29/577 |
| 3,300,832 | 1/1967 | Cave | 29/580 |
| 3,243,323 | 3/1966 | Corrigan et al. | 148/175 |
| 3,000,768 | 9/1961 | Marinace | 148/1.5 |

*Primary Examiner*—W. C. Tupman

[57] ABSTRACT

A monolithic integrated circuit structure is fabricated having a plurality of discrete single crystal semiconductor islands supported by and intimately bonded to a common substrate, including an insulating material to isolate the monocrystalline islands. The method of fabrication includes the steps of removing semiconductor material from selected areas of one side of a monocrystalline semiconductor body, replacing the removed material with an insulating layer and a support member, and then removing single crystal material from the opposite side of the wafer to expose portions of said insulating layer thereby providing monocrystalline islands for the fabrication therein of semiconductor devices.

8 Claims, 15 Drawing Figures

INVENTOR.
Tommie R. Huffman

BY
Mueller, Aichele & Rauner
ATT'YS.

INVENTOR.
Tommie R. Huffman
BY
Mueller, Aichele & Rauner
ATT'YS.

INVENTOR.
Tommie R. Huffman

BY
Mueller, Aichele & Rauner
ATT'YS.

INVENTOR.
Tommie R. Huffman
BY Mueller, Aichele & Rauner
ATT'YS.

METHOD OF MAKING SEMICONDUCTOR DEVICES

This application is a division of application Ser. No. 440,421, filed Mar. 17, 1965, now U.S. Pat. No. 3,393,349 and which is a division of application Ser. No. 363,802, filed Apr. 30, 1964, now abandoned.

This invention relates to a method of making semiconductor integrated circuits, and more particularly to a method of making an integrated circuit structure having discrete semiconductor regions which are electrically insulated from one another by a film of material encompassing each region on all sides and the bottom.

Monolithic integrated circuits normally have a number of active devices such as transistors and diodes formed in a single semiconductor crystal element, and passive devices such as resistors and capacitors also formed in or on the same semiconductor element. These are interconnected into a circuit by a pattern of metallization on an insulating film covering the surface of the semiconductor element. In order to avoid unwanted interaction of the devices with each other, it is necessary to provide isolation between the active regions or islands in the structure. Up to the present invention, the isolation has been provided either by PN junctions or resistors fabricated in the semiconductor element between the active regions.

PN junction isolation, wherein regions known as islands are electrically separated from one another, has typically been achieved by fabricating the integrated circuits so that each active device has an extra PN junction surrounding it. There are two oppositely oriented isolation junctions between each pair of the devices, and these junctions constitute back-to-back diodes. In some cases, the oppositely oriented junctions have been in the form of a grid-like pattern which divides the semiconductor wafer into islands, each of which is surrounded by an isolation junction.

One specific way of fabricating such isolation junctions is to diffuse an impurity through a semiconductor wafer only at portions of the wafer between the island regions. The diffused region has a junction on each side of it and the latter junctions are oppositely oriented so that when one junction is biased in the forward direction, the other will be biased in the reverse direction. Thus, although the forward biased junction can pass current, the reverse biased junction has a very high resistance and so isolates the island regions from each other. One of the junctions will be reverse biased in any operating condition.

The processing required to diffuse impurities all the way through a semiconductor wafer to form such oppositely oriented junctions is very severe. The wafer must be heated for many hours at very high temperatures in order to diffuse an impurity all the way through the wafer. An alternative approach is to grow an epitaxial semiconductor layer of one conductivity type on a substrate crystal element of the opposite conductivity type, and then diffuse an impurity through selected portions of the epitaxial layer to form islands surrounded by isolating junctions. The active devices are then built in the islands. One potential leakage path goes from one island to another via the substrate crystal, and another such path goes between devices via the epitaxial layer. Since each island is surrounded by its own isolation junction, both paths have oppositely oriented junctions in them which provide isolation in the manner described previously.

Regardless of how the isolating junctions are formed, they introduce parasitic capacitance into the integrated circuit. Any reverse biased PN junction acts as a capacitor. In the case of a transistor having an associated isolation junction, the switching speed of the transistor is dependent on the saturation resistance $R_S$ of the transistor and the parasitic capacitance $Cp$ which includes the capacitance of the isolation junction. In order to improve the power speed product of the switching transistor, both the saturation resistance and the parasitic capacitance must be minimized. Measurements made on standard integrated circuits using back-to-back diode isolation indicate that the isolation junction capacitance may be of the order of 30 to 35 picofarads. It would be very desirable to reduce this capacitance to thereby improve the power speed product.

Resistive isolation has been used in some integrated circuits. In some cases, high resistivity material has been used for the bulk semiconductor material so that the material between active regions has enough resistance to isolate active devices from each other. It is difficult, however, to achieve accurate resistance values for the isolation, and also the lightly doped bulk material has a high temperature coefficient which can adversely affect the temperature stability of the circuit. As alternatives, it has been proposed to use diffused resistors or a single diffused junction for isolation between active regions, but these techniques also have drawbacks.

As a means of reducing parasitic capacitance, it has been proposed to build monolithic integrated circuits by growing a semiconductor crystal epitaxially on an insulating single crystal substrate. Although it is theoretically possible to grow a semiconductor crystal on another crystal of a different material, there are many difficulties. Unless there is an almost perfect lattice match between the two chemically different materials, the semiconductor material will not grow in the form of a single crystal, and up to the present time no two materials have been found which have a sufficiently close lattice match to make this a practical manufacturing technique.

It is an object of this invention to provide improved isolation for semiconductor integrated circuits.

Another object of the invention is to reduce parasitic capacitance in integrated circuits, particularly that capacitance associated with isolation between active regions of the semiconductor element of an integrated circuit.

Another object of the invention is to improve the power speed product of switching transistors and switching circuits built in the form of integrated circuits.

A further object of the invention is to provide a method of isolating active and passive regions of an integrated circuit from each other without relying on PN junctions nor regions of the semiconductor crystal element to provide the isolating impedance.

Still another object of the invention is to provide an improved method of fabricating integrated circuits with reduced parasitic capacitance which method can be carried out economically on a mass production scale.

The invention is illustrated by the accompanying drawings, in which.

Figure 1:
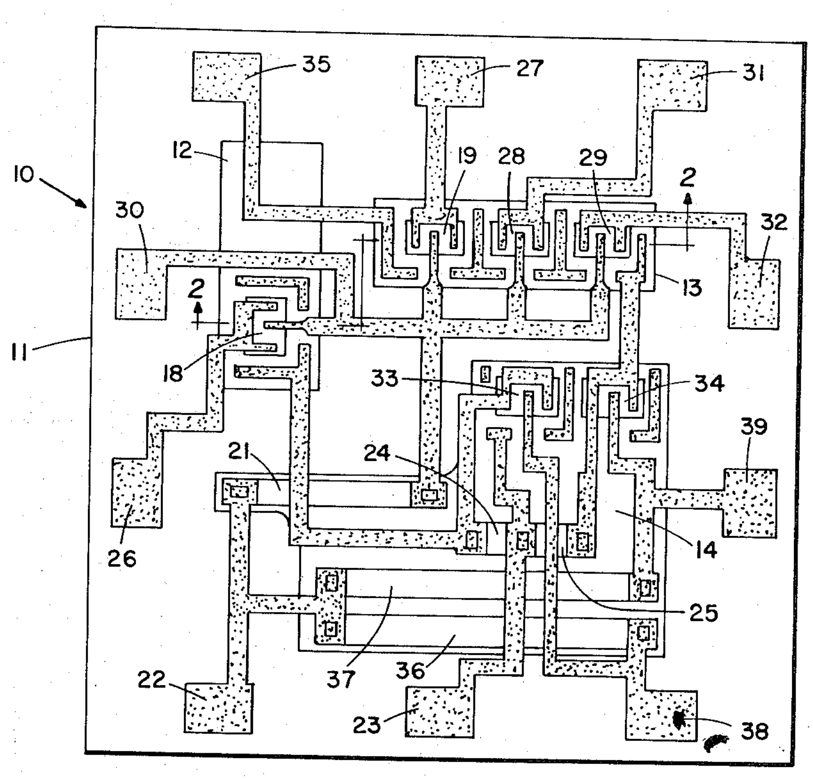
FIG. 1 is an enlarged view of an integrated circuit structure having insulating isolation, which constitutes one embodiment of the invention.

The invention has several aspects, but is based on the use of insulating isolation in integrated circuits. The invention embraces an integrated circuit structure having such insulating isolation, and also a method of fabricating integrated circuit structures having insulating isolation as will be described further.

One product embodiment of the invention comprises an integrated circuit having a plurality of discrete single crystal semiconductor islands supported by and intimately bonded to a common substrate which includes insulating material isolating the islands from each other. For convenience of description, the supporting material will be referred to as the substrate. In this embodiment, there is an insulating oxide film intermediate between each semiconductor island and the substrate. If the substrate has proper insulating isolation properties, the dielectric material between the substrate and single crystal islands may be eliminated. In fact, the intermediate material may be an electrical conductor such as a metal if the substrate is a good dielectric. This metal permits a low resistance connection to the island. The oxide films of this embodiment adhere well to both the single crystal semiconductor material and the substrate material. The substrate may be either a crystalline, or an amorphous material. Glass is an example of the latter material.

Since the oxide film is insulating, it is not essential that the rest of the substrate be insulating, but that is the preferred form. By using only a thin film of oxide and a thicker substrate, it is possible to select the specific materials such that their coefficients of expansion match well enough that the integrated circuit structure will withstand the various high temperature processing steps and mechanical stressing steps that are used in the fabrication of integrated circuits. The oxide film may be considered to be part of the substrate, but for ease of description in this specification, it will be referred to separately. In a specific embodiment, the islands are single crystal silicon, and the substrate is polycrystalline silicon. These two silicon phases, namely the single crystal and polycrystalline silicon portions of the structure are separated by a film of silicon dioxide which is bonded to both phases.

A preferred method of making such an integrated circuit will be described with reference to the particular structural embodiment just referred to; that is, the single crystal silicon/silicon dioxide/polycrystalline silicon structure. It will be understood, however, that the invention, including the product aspect and the method aspect, is not restricted to these particular materials. Any other materials, however, must meet the requirements described above for a commercially practical integrated circuit structure.

A basic integrated circuit structure may be fabricated by growing a silicon dioxide film on at least one side of a single crystal silicon wafer, and then depositing enough polycrystalline silicon on the oxide film to build up the over-all thickness of the structure to a point where it will withstand all further processing required to fabricate integrated circuits. This basic structure, and the method of making it, may be modified in various ways in the fabrication of practical circuit structures. In accordance with one modification, after growing the oxide film on the silicon crystal element or wafer, the oxide is removed at the places where it is desired to have isolation. Silicon is removed from the exposed area of the crystal element, preferably by etching, to a depth corresponding to the thickness desired for the islands to be fabricated later, and thus provide a moat to such depth. Silicon dioxide is then formed on the surface of the moat or depression, formed by the etching, to again form a continuous oxide film on the surface of the silicon crystal. Polycrystalline silicon is then deposited on the oxide film from silicon-bearing vapors to build up the thickness of the composite structure so that it can be handled in further processing. The polycrystalline silicon fills the moat or depression referred to previously, and, therefore, is interposed between the portions of the silicon crystal which ultimately become the islands of the integrated circuit structure.

The islands may then be formed by simply removing single crystal silicon from the side of the crystal element or wafer opposite to that side on which the polycrystalline silicon was deposited. This removal may be accomplished by first lapping the single crystal side to make the faces of the composite structure parallel and then polishing, either chemically or with an abrasive, the "back" side of the crystal element. By polishing just through the oxide at the bottom of the silicon-filled depression, the remaining single crystal silicon is in the form of discrete islands surrounded by polycrystalline silicon.

Thus, the lapping of the single crystal side of the structure removes the single crystal material down into the oxide film deposited on the surface of the moat.

The polycrystalline silicon comprising the substrate has a very high resistivity, as does the oxide film around the islands, and the islands are thus electrically isolated from each other by insulating materials. Since these two materials are relatively thick — much thicker than the effective thickness of a PN junction of the prior art — there is very little capacitance between the islands. Active devices such as transistors and diodes, and passive devices such as resistors and capacitors may be fabricated in the single crystal islands by the use of conventional semiconductor processing. The active or passive devices may be interconnected by metallization to complete the fabrication of the integrated circuit. In addition to active and passive devices, thin films may be formed on the structure, and the devices within such thin films may be included in the circuit, if desired. When the circuit is operated, there is less undesired interaction between its individual devices than is the case in conventional monolithic integrated circuits having PN junction isolation, because there is less parasitic capacitance in the present invention than is encountered when these isolating PN junctions are used.

Additionally, the devices of the present invention may be designed so as to optimize circuit performance to a greater degree than was previously possible because, unlike monolithic integrated circuit structures, the single crystal silicon on which devices are constructed is not used for the resistive isolation.

A particular integrated circuit structure with insulating isolation will be described with reference to FIGS. 1–3 as an example of a product embodiment of the invention. Methods for making such structures will be described in connection with FIGS. 4 and 5, and modifications will then be described referring to FIGS. 6–9.

Figure 2:
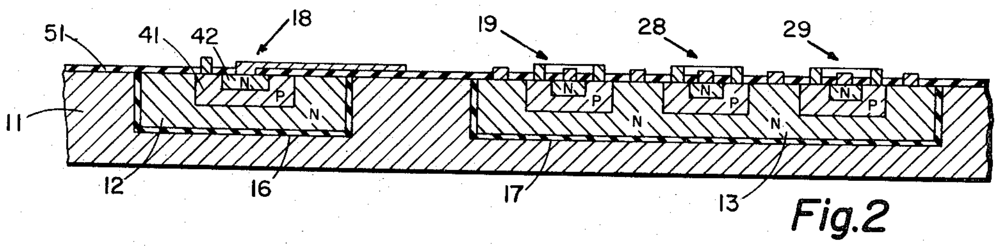
FIG. 2 is an enlarged fragmentary cross sectional view taken along line 2—2 of FIG. 1.

The integrated circuit structure 10 of FIGS. 1 and 2 has an insulating or dielectric substrate 11, and there are three islands 12, 13 and 14 embedded in the substrate in which the active devices of the circuit are formed. FIG. 3 is a schematic circuit diagram for the integrated structure of FIGS. 1 and 2. In FIG. 3, the islands 12, 13 and 14 are represented by dashed-line enclosures, and FIG. 3 shows more clearly the electrical nature of the active devices which have been fabricated in the islands. The layout of the devices in FIG. 3 corresponds to the integrated circuit layout in FIG. 1.

The substrate 11 is a polycrystalline or amorphous insulating material and thus very effectively isolates the islands 12, 13 and 14 from each other. The islands are single crystal semiconductor material. As may be seen in FIG. 2, there are insulating films 16 and 17 between the islands 12 and 13 and the polycrystalline or amorphous substrate 11. There is also an insulating film around the third island 14 which does not appear in FIG. 2. In this illustrative embodiment, the insulating films are an oxide material which adheres well to both the single crystal islands 12, 13 and 14 to the polycrystalline or amorphous substrate 11.

Figure 3:
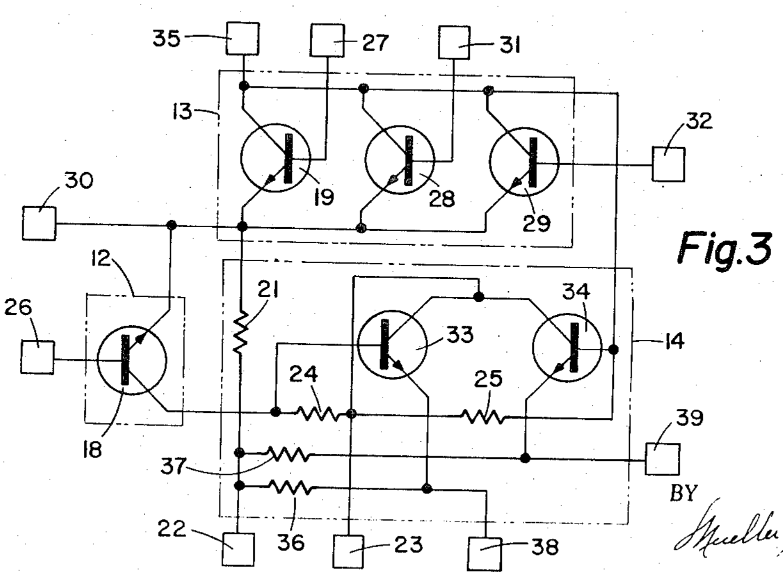
FIG. 3 is a schematic diagram of the circuit which is integrated in the structure of FIG. 1.

The circuit of FIG. 3 is a current mode logic gate. It is comprised of transistors 18, 19, 28, 29, 33, 34 and resistors 21, 24, 25, 36, 37 which are interconnected by thin film aluminum. Electrical connection to the circuit is made by attaching connecting leads to aluminum terminals 22, 23, 26, 27, 30, 31, 32, 35, 38 and 39.

Three transistors 19, 28, 29 are isolated and fabricated into the same island 13 (FIG. 2), and the bulk or body material of that island serves as a common collector for the transistors. Transistor 18 is the only circuit device in island 12. As illustrated in FIG. 2, the bulk semiconductor material of the island 12 serves as the collector of the transistor 18 and the base region 41 and the emitter region 42 have been formed in the island by selective diffusion techniques. The bases and emitters of these transistors 19, 28 and 29 on island 13 have also been formed by selective diffusion, and ordinarily will be formed in the same corresponding diffusion steps used to fabricate the base region 41 and the emitter region 42 of transistor 18. Thus, the insulation isolated integrated circuit structure has an important advantage for monolithic integrated circuits; i.e., many individual devices can be formed by the same processing steps and so the electrical parameters of all devices in the same structure should be well matched to each other.

The third island 14 contains all of the other components. Transistors 33 and 34 are NPN diffused transistors of the same type as the transistors shown in FIG. 2, and they have a common collector region in the island 14. The resistors 21; 24, 25, 36 and 37 have been fabricated by diffusing an impurity into strip-like regions of the island 14 to convert the strip-like regions to the opposite conductivity type. Contacts are then provided at opposite ends of the strips and the resistors are interconnected with the other components according to the circuit of FIG. 3 by means of metallization on the oxide film 51 which covers the top surface of the integrated circuit structure.

A satisfactory combination of materials which will stand the high temperature processing steps and the mechanical steps used in fabricating integrated circuits requires that all the materials adhere to each other properly and have compatible coefficients of expansion. Silicon is the preferred material for the single crystal islands, but it will be evident that other semiconductors, both elemental materials and compound materials, are alternatives. At the present stage of development, it appears that polycrystalline silicon is the best substrate material for use with single crystal silicon islands. The intermediate oxide film may then be silicon dioxide since it adheres well to both the single crystal and polycrystalline silicon phases. An integrated circuit structure can be built using these materials by manufacturing techniques which are well established and have proven reliability in the semiconductor art. A metal such as molybdenum might be used for the substrate since it will bond well to the silicon dioxide film and has thermal expansion characteristics which are compatible with the other materials. A polycrystalline metal substrate of this kind is electrically conductive, so the dielectric (oxide) films are relied on to provide the necessary electrical isolation between the islands. An amorphous material (i.e.,glass) may also be used for the substrate. It will be evident that if the polycrystalline or amorphous substrate is insulating, it may be possible to omit the oxide films. This depends on whether the substrate material adheres well enough to the single crystal islands to withstand the stresses encountered during further processing.

Basic steps in the fabrication of the integrated circuit structure will be described in connection with FIG. 4, and the more detailed steps will then be described referring to FIGS. 5A through 5G.

Starting material for making an insulation isolated integrated circuit structure is a single crystal silicon wafer. Such wafers are typically obtained from larger silicon crystals which may be grown by known crystal pulling or zone melting processes. The larger silicon crystal is sliced into wafers, and the wafers are lapped, polished and otherwise processed to make their major faces smooth and substantially parallel to each other. The cross sectional dimension of the wafer may be of any value, and the thickness of the wafer can be within a practical range such as 4 to 10 mils. In FIG. 4, a rectangular wafer 56 is shown at A, but it will be understood that the wafer may be circular or have some other shape if desired.

A thin film 57 of silicon dioxide (see B of FIG. 4) is formed on one of the two faces of the wafer. The oxide may be formed in any of several available ways, and one suitable procedure is to heat the wafer in an atmosphere of air and steam to oxidize its surface. By this thermal oxidation method, a silicon dioxide film one or two microns thick may be grown in a reasonable time. Ordinarily, the film will cover the entire wafer, and in this case the oxide may or may not be removed from one side of the wafer before further processing.

Etching through openings in the oxide layer serving as a mask will be described for the illustrations of FIGS. 5B and 5C, but basic steps will be described for step C in FIG.4.

Figure 4:
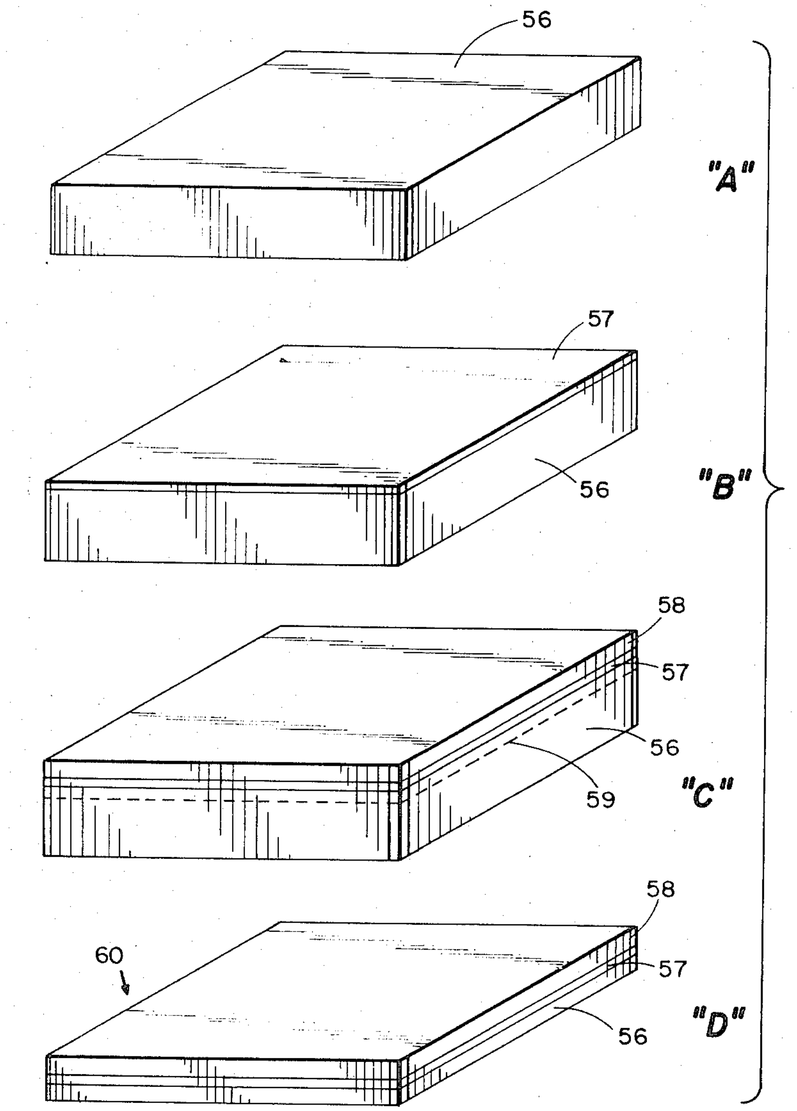
FIG. 4 is a series of isometric views illustrating certain basic steps of the method of making an integrated circuit with insulating isolation in accordance with the method aspect of the invention.

A layer 58 of polycrystalline silicon is formed on the oxide film 57 (see C of FIG. 4). Again, there are several suitable ways of forming the polycrystalline silicon on the oxide. The best results have been obtained by depositing silicon from silicon-bearing vapors in a furnace by the same techniques which have been used extensively for epitaxial growth of silicon on single crystal wafers. Where the silicon is grown on an oxide film, as is the case here, the deposit will be polycrystalline. The silicon may be deposited from vapors of a volatile silicon compound such as silane ($SiH_4$), silicon tetrachloride ($SiCl_4$), or a hydrogen-halide compound of silicon such as trichlorosilane ($SiHCl_3$). By properly selecting the conditions of silicon deposition, it is possible to form homogeneous layers of polycrystalline silicon on the silicon dioxide surface. Suitable deposition conditions are as follows: In a combustion tube type furnace having an inner tube diameter of 70 millimeters, the silicon is heated to about 1,100°C. while a gaseous mixture of silicon tetrachloride and hydrogen flows over the silicon. Silicon tetrachloride is introduced into the tube at 200 cubic centimeters per minute and hydrogen is introduced at 25 liters per minute. Exposure of the silicon to this environment deposits a layer of polycrystalline silicon six to seven mils thick.

After deposition of the polycrystalline silicon layer 58, the structure appears as shown at C in FIG. 4. The oxide film 57 is sandwiched between the single crystal silicon 56 and the polycrystalline silicon 58. In this description of fabrication the thickness of the single crystal silicon 56 is reduced, and it has been found desirable to reduce its thickness to approximately one mil. Thus, the single crystal silicon can be removed down to the dashed line 59 shown at step C of FIG. 4 to form the structure 60 shown at D of FIG. 4. The removal of silicon may be accomplished by one of several techniques such as known lapping and polishing procedures or chemical etching processes.

Two-dimensional isolation is provided in the structure 60 in D of FIG. 4, but this is not part of the present invention, for if active and/or passive devices would be built into the single crystal silicon 56, they would not be isolated from each other by insulating material on all sides and the bottom as has been referred to for the present invention. The most advantageous application of the present invention is embodied in an integrated circuit in which electrical insulating isolation is provided between islands of single crystal silicon in the manner described in connection with FIG. 1. The method steps illustrated by FIG. 4 are modified so as to allow fabrication of such islands, and these details of this invention will be described in connection with FIGS. 5A through 5H.

Figures 5A, 5B, 5C, 5D, 5E, 5F:
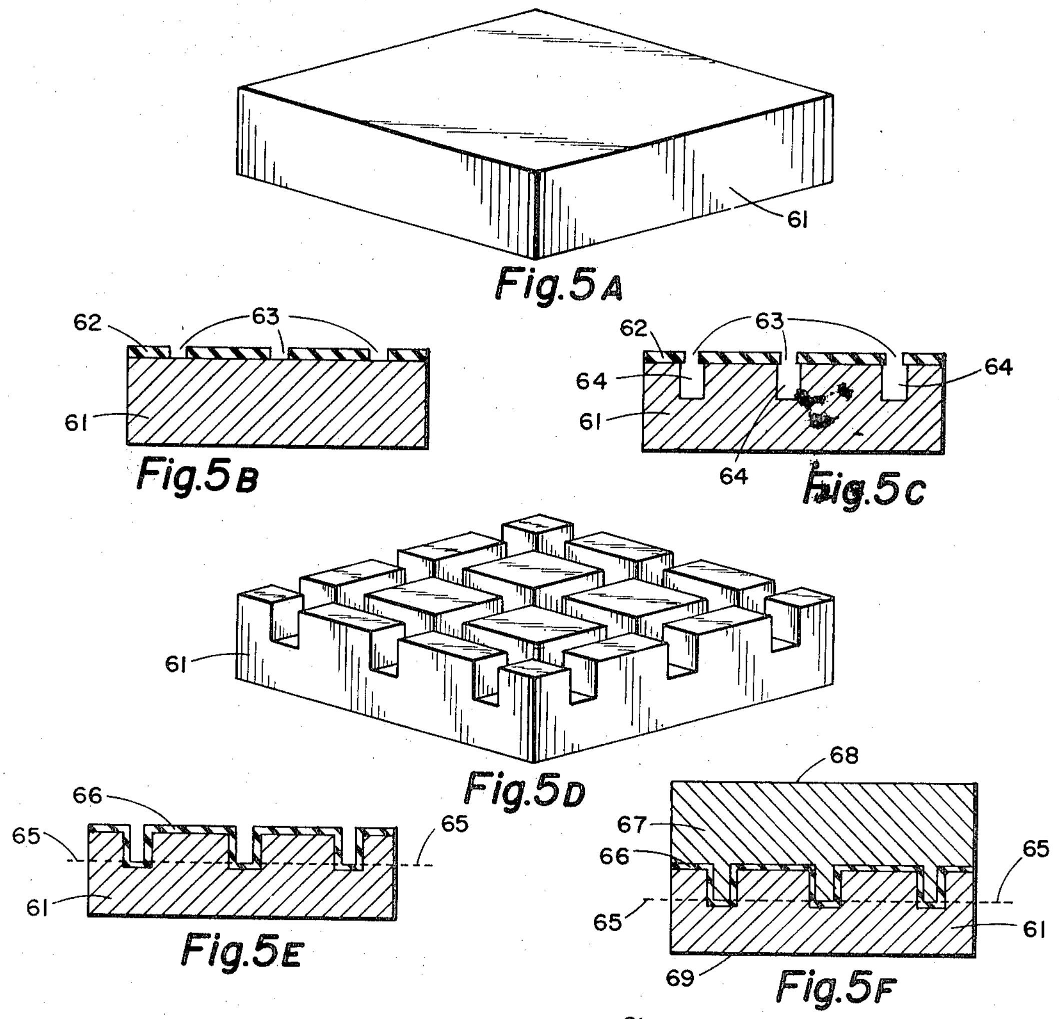
FIGS. 5A through 5G are views showing the condition of a particular integrated circuit structure at various stages of its fabrication by the method of the invention.

FIG. 5A is a single crystal silicon wafer 61 like the wafer 56 of FIG. 4. A silicon dioxide film 62 is formed on one side of this wafer in the manner described previously. Before depositing polycrystalline silicon on the oxide film, however, some additional steps are employed. Openings 63 are made through the oxide film to expose the underlying silicon, and this may be done by known photo-resist masking and etching procedures. Cavities 64 are then formed under the openings 63 by etching, and the resulting structure is shown in FIG. 5C. Although individual cavities 64 appear in these sectional views, it will be apparent from FIG. 1 that in a practical integrated circuit structure there may actually be a single depression from which the islands project. Satisfactory methods of forming the depression or cavities include etching them in a suitable etching solution which does not attack the oxide film or expose the structure to gaseous hydrogen chloride while heating it at a temperature sufficient to cause etching of the silicon by the hydrogen chloride. This latter etching process is described fully in a copending application of Wilfred J. Corrigan and David L. Smith, Ser. No. 201,556, filed on June 11, 1962. The etching is continued to a depth corresponding to a desired thickness for the islands, and in a particular embodiment that depth is 25 microns (1 mil).

The original silicon dioxide film 62 may then be removed from the top surface of the wafer, and the structure will appear as shown in FIG. 5D, honeycombed with cavities corresponding to those illustrated by the reference 64 in FIG. 5C. A new silicon dioxide film is grown on the wafer (FIG.5E), and this new oxide film 66 covers the surfaces of the depression or the cavities as well as the top surface of the wafer.

Polycrystalline material 67 is then deposited on the oxide film 66 to a desired thickness, and in a particular embodiment the polycrystalline silicon is approximately 6 mils thick. As is evident from FIG. 5F, the polycrystalline silicon 67 fills the cavities or depression previously formed in the single crystal silicon 61.

The next step is to reduce the thickness of the single crystal silicon, for example, by lapping and polishing the bottom surface 69 of the structure shown in FIG. 5F. First, however, it is desirable to lap the surface 68 of the polycrystalline silicon to assure that it will be parallel to the surface 69 of the single crystal silicon. The surface 69 is then polished to remove silicon from the structure, and the polishing is continued just through the oxide at the bottom of the depression as shown by the dotted line 65—65 in FIG. 5F. In the particular embodiment being described, the silicon crystal wafer originally had a thickness of 6 mils, and 5 mils are removed such that the remaining single crystal silicon will be one mil thick. The oxide can be removed by polishing, but the removal is slow. Therefore, the oxide acts as a "stop" in the polishing operation and helps in attaining islands of a desired depth or thickness.

Figure 5G:
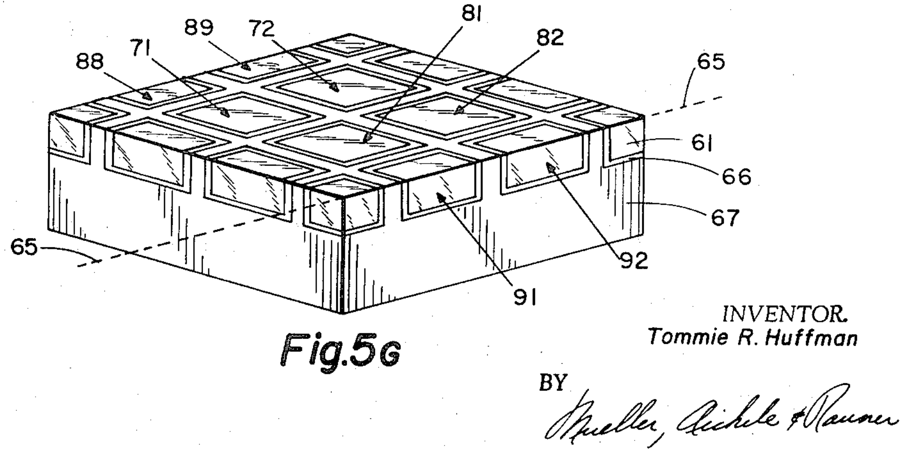

The structure at this stage of the processing is shown in FIG. 5G inverted from the position of FIG. 5F such that the single crystal silicon 61 is on top, but now reduced in thickness by the removal of material to the dotted line 65—65, described above for FIG. 5F. The reference character 61 is applied to the material of the right-hand corner island only in FIG. 5G, but it is understood that the material within each island is single crystal semiconductor material. It may be seen that the remaining single crystal silicon is in the form of islands 71, 72, 81 and 82 which are isolated from each other by the polycrystalline silicon 67 and the remaining portions of the oxide film 66. Thus, the structure of FIG. 5G is ready to have active and/or passive devices fabricated in the islands 71, 72, 81 and 82, in the manner known in the art, and those devices may be interconnected through contacts thereon and connecting means from the contacts so as to form a complete integrated circuit of the type described in connection with FIGS. 1–3.

In order to simplify an understanding of the inverted position of the structure in FIG. 5G relative to FIG. 5F, the dotted line 65—65 representation is applied to FIGS. 5E and 5G, but the removal is accomplished with the structure in the condition shown in FIG. 5F.

The structure and method of the invention may be modified in many ways in order to form special devices in the islands. Some of these modifications will be described with reference to FIGS. 6 through 9, but it will be understood that other modifications are possible and are within the scope of the invention.

Figure 6:
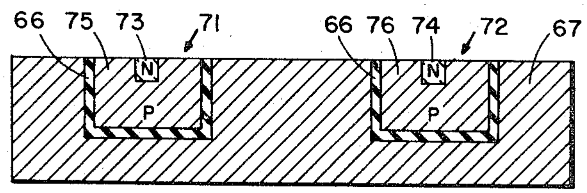
FIG. 6 is a schematic cross section of an integrated circuit structure showing one type of active device which may be built in the islands.

FIG. 6 is a schematic cross sectional view of an integrated circuit structure which has two islands 71 and 72. The islands contain N regions 73 and 74 as well as P regions 75 and 76, and there are rectifying junctions between the N and P regions. It is sometimes desirable to fabricate junctions such that the impurity gradient, as measured starting from the junction, decreases on both sides of the junction with increasing distance from the junction. Such a structure may be fabricated by incorporating a doping impurity in the oxide film 66 at the time it is grown, such that the impurity diffuses out from the oxide into the islands 71 and 72, either during oxide growth, or in a further processing step or at both stages. The impurity concentration will decrease going from the junction into the N region. It will be understood that regions 75 and 76 may be made N type and regions 73 and 74 may be made P type by appropriate selection of impurity materials. Thus, the invention allows one to fabricate junction structures in integrated circuits which could not previously be attained by known integrated circuit fabrication processes.

Figure 7:
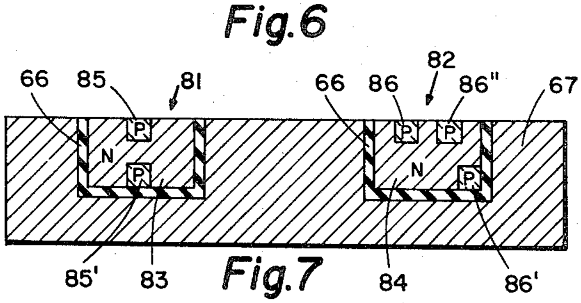
FIG. 7 is a cross sectional view similar to FIG. 6 but showing a different kind of active device in the islands.

FIG. 7 shows another integrated circuit structure in which junctions have been formed in islands 81 and 82. The junction configuration illustrated in FIG. 7 would be difficult to obtain by previously known procedures, but can be fabricated easily in accordance with the invention. The N regions 83 and 84 may be formed by N doping the original silicon crystal from which the original wafer 61 (FIGS. 5A to 5G inclusive) was cut. These regions or islands are provided in the polycrystalline or the amorphous substrate 67, and are insulatingly isolated by the silicon dioxide regions 66. P regions 85 and 85' can then be formed by selective diffusion of an acceptor impurity into the N type material at the appropriate places in island 81, and diffused in different steps. This is likewise ture of P regions 86, 86', and 86'' in the island 82. Regions 86 and 86'' are diffused at one time and region 86' at another time in island 82. The oxide 66 is grown for each island, and the wafer is further processed as has been described in connection with FIGS. 5B through 5G. The devices in the islands 81 and 82 respectively are discrete relative to one another.

Figure 8:
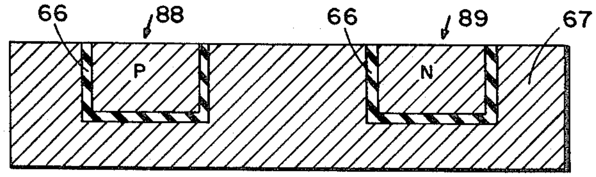
FIG. 8 shows another form of the integrated circuit stucture in which one island is P type and the other island is N type.

FIG. 8 shows an integrated circuit structure which has one P type island 88 and one N type island 89. These islands are shown for illustrative purposes by these reference characters in FIG. 5G. A structure of this type can be fabricated by starting with one type of semiconductor material and converting selected island areas to the other type semiconductor material, for example, by diffusion. Alternatively, the semiconductor material in one or more islands may be partially etched away and epitaxial material of the desired conductivity type deposited to replace the semiconductor material etched away. Thus, it is possible to have different types of semiconductor material in different islands in the same integrated circuit structure. This illustrates the compatibility of NPN, and PNP devices on the same monolithic substrate.

Figure 9:
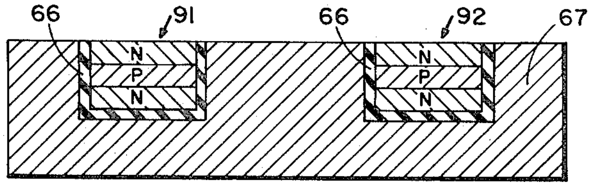
FIG. 9 shows still another integrated circuit structure in which the islands are made up of epitaxial layers.

FIG. 9 is a similar view of an integrated circuit structure, but showing alternate conductivity epitaxial layers in the islands 91 and 92. This view merely illustrates that it is possible to use epitaxial growth techniques in order to produce any desired combination of semiconductor layers in the islands of the integrated circuit structure.

As previously mentioned, if a good dielectric material is used as a substrate material, the dielectric film separating the islands from the substrate is optional. Certain high dielectric oxides have thermal expansion coefficients which are close enough to that of the island material so that they will be especially well-suited for substrates, e.g., aluminum oxide is a good substrate material to be used with single crystal silicon island material. It is intended that the scope of this invention particularly include the use of aluminum oxide as a substrate material.

The methods shown and described above have included the formation of a plurality of components to make up an integrated circuit; obviously, single components, e.g., high frequency transistors, could be manufactured in accordance with this invention and it is intended that the scope of the invention include such manufacture.

The structures of FIGS. 6 through 9 suggest the wide variety of semiconductor devices which may be built in an insulatingly isolated integrated circuit structure in accordance with the present invention. As has been mentioned, there is little or no capacitance from island to substrate and from island to island, and this avoids undesirable interaction between the devices in the isolated islands. For purposes of building logic type switching circuits such as that described in connection with FIGS. 1–3, the reduction of parasitic capacitance improves the switching speed and the power-speed product of the circuit. It is also possible to reduce the saturation resistance of transistors built in the islands, and this conserves power and further optimizes the power-speed product of switching circuits. Integrated circuit structures and individual devices of the type described herein may be fabricated in accordance with this invention using well-established, reliable semiconductor processing steps, so the invention can be put into practice comparatively easily on a mass production scale.

I claim:

1. A method of forming a plurality of semiconductor devices in a monolithic integrated semiconductor structure comprising the steps of etching away portions of substrate supported, electrically isolated islands of monocrystalline semiconductor material so that the islands assume a cup-shaped form, epitaxially growing regions of monocrystalline semiconductor material of one type conductivity on the inner surfaces of the cups, forming at least one region of the opposite type conductivity in each of said epitaxially grown regions of monocrystalline semiconductor material, and forming individual electrical contacts to selected regions of said monolithic integrated semiconductor structure.

2. A method of forming a plurality of semiconductor devices in a monolithic integrated semiconductor structure comprising the steps of a. etching away portions of substrate supported, electrically isolated islands of monocrystalline semiconductor material so that each island so etched has a recess which assumes a cup-shaped form, b. epitaxially growing a region of monocrystalline semiconductor material of one type conductivity in such cup-shaped recess in an island, c. forming at least one region of the opposite type conductivity in said epitaxially grown region of monocrystalline semiconductor material in said island, and d. forming individual electrical contacts to selected regions of said monolithic semiconductor structure.

3. In the method of claim 2, a. etching away a plurality of portions in a substrate supported electrically isolated island of monocrystalline semiconductor material to provide a corresponding plurality of recesses in that island with each of cup-shape, b. epitaxially growing a region of monocrystalline semiconductor material of one type conductivity in each said recess, and c. forming at least one region of the opposite type conductivity in each said epitaxially grown region.

4. In the method of claim 2 wherein the forming step (c) includes forming more than one region of the opposite type conductivity in said epitaxially grown region of monocrystalline semiconductor material.

5. In the method of claim 2 wherein epitaxially growing comprises the growing of a region of monocrystalline semiconductor material of one type conductivity in the cup-shaped recess in one island in such substrate and the growing of a region of monocrystalline semiconductor material of the opposite type conductivity in the cup-shaped recess in another island in such substrate.

6. In the method of claim 2 wherein the isolation for a substrate supported, electrically isolated island of monocrystalline semiconductor material is accomplished by silicon dioxide with a doping impurity therein, the step of causing said doping impurity to diffuse into monocrystalline semiconductor material in said island.

7. A method of forming a plurality of semiconductor devices in a monolithic integrated semiconductor structure comprising the steps of a. etching away portions of substrate supported, electrically isolated islands of monocrystalline semiconductor material so that the islands assume a cup-shaped form, b. epitaxially growing a region of monocrystalline semiconductor material of one type conductivity on the inner surface of the cup of at least one island, c. epitaxially growing a region of monocrystalline semiconductor material of the opposite type conductivity on the inner surface of the cup for another island, d. forming at least one region in said epitaxially grown region in said one island and forming at least one region in said other island, each said one region being of opposite type conductivity to the type conductivity of the epitaxially grown regions in said respective islands, and e. forming individual electrical contacts to selected regions of said monolithic integrated semiconductor structure.

8. A method of forming a plurality of semiconductor devices in a monolithic integrated semiconductor structure comprising the steps of a. etching away a portion of a substrate supported, electrically isolated island of monocrystalline semiconductor material so that such island so etched has a recess which assumes a cup-shaped form, b. epitaxially growing a plurality of adjacent regions of monocrystalline semiconductor material in such cup-shaped recess, c. providing each adjacent region in such cup-shaped recess of such island of an opposite conductivity type to the conductivity type of such adjacent region, and d. forming individual electrical contacts to selected regions of said monolithic semiconductor structure.

* * * * *